(12) United States Patent
Toquet et al.

(10) Patent No.: US 11,340,282 B2
(45) Date of Patent: May 24, 2022

(54) REFLECTOMETRY SYSTEM FOR DETECTING FAULTS ON A HARDENED MULTIPOINT CONNECTOR OF AN ELECTRICAL NETWORK

(71) Applicant: NAVAL GROUP, Paris (FR)

(72) Inventors: Nicolas Toquet, Cherbourg-en-Cotentin (FR); Philippe Keraudren, Cherbourg-en-Cotentin (FR)

(73) Assignee: Naval Group, Paris (FR)

( * ) Notice: Subject to any disclaimer, the term of this patent is extended or adjusted under 35 U.S.C. 154(b) by 11 days.

(21) Appl. No.: 16/616,263

(22) PCT Filed: May 17, 2018

(86) PCT No.: PCT/EP2018/063008
§ 371 (c)(1),
(2) Date: Nov. 22, 2019

(87) PCT Pub. No.: WO2018/219682
PCT Pub. Date: Dec. 6, 2018

(65) Prior Publication Data
US 2020/0088781 A1 Mar. 19, 2020

(30) Foreign Application Priority Data

May 29, 2017 (FR) ..................... 17 00557

(51) Int. Cl.
*G01R 31/11* (2006.01)
*G01R 31/50* (2020.01)
(Continued)

(52) U.S. Cl.
CPC ............ *G01R 31/11* (2013.01); *G01R 31/085* (2013.01); *G01R 31/088* (2013.01);
(Continued)

(58) Field of Classification Search
CPC ............ G01R 31/50–71; G01R 31/085; G01R 31/2887; G01R 31/2889
See application file for complete search history.

(56) References Cited

U.S. PATENT DOCUMENTS 4,325,022 A 4/1982 Pelletier
4,773,878 A * 9/1988 Hansell, III ......... H01R 12/775
439/497

(Continued)

OTHER PUBLICATIONS

Loete, "Diagnostic of connector's degradation level by Frequency Domain Reflectometry," Institute of Electrical and Electronics 58th Holm Conference, 2012, 4 pages.

*Primary Examiner* — Patrick Assouad
*Assistant Examiner* — Demetrius R Pretlow
(74) *Attorney, Agent, or Firm* — Steven M. Ritchey; Thompson Coburn LLP

(57) ABSTRACT

The invention relates to a reflectometry system for detecting faults on a hardened multipoint connector of an electrical network, of the type that comprises a measuring probe, characterized in that it comprises an interfacing and impedance matching part that is electrically suitable for mounting on the connector to be tested and comprises a body provided with at least one element in the form of a collector ring for the contact masses of the connector and a measuring opening for the probe of the reflectometry system.

6 Claims, 2 Drawing Sheets

(51) Int. Cl.
   *G01R 31/08*   (2020.01)
   *G01R 31/28*   (2006.01)
(52) U.S. Cl.
   CPC ..... *G01R 31/2887* (2013.01); *G01R 31/2889* (2013.01); *G01R 31/50* (2020.01)

(56) References Cited

U.S. PATENT DOCUMENTS

| | | | | |
|---|---|---|---|---|
| 5,268,644 | A * | 12/1993 | Klassen | G01R 31/11 324/503 |
| 5,903,156 | A * | 5/1999 | Matsumaru | G01R 31/11 324/533 |
| 6,002,501 | A * | 12/1999 | Smith | G01M 3/28 356/44 |
| 6,442,498 | B1 * | 8/2002 | Krigel | G01R 31/58 702/108 |
| 7,075,310 | B2 * | 7/2006 | Mason, Jr. | G01R 31/085 324/512 |
| 7,525,319 | B1 * | 4/2009 | Ahmed | G01R 31/70 324/538 |
| 8,912,800 | B2 * | 12/2014 | Gervais | G01R 31/58 324/508 |
| 10,432,258 | B1 * | 10/2019 | Mitchell | B60L 53/14 |
| 10,520,529 | B2 * | 12/2019 | Freer | G01R 1/07378 |
| 10,704,827 | B2 * | 7/2020 | Freer | H02H 11/002 |
| 2002/0130668 | A1 * | 9/2002 | Blades | G01R 31/11 324/536 |
| 2004/0183544 | A1 * | 9/2004 | Allan | G01R 31/58 324/533 |
| 2005/0168229 | A1 * | 8/2005 | Onodera | G01R 31/11 324/533 |
| 2005/0182581 | A1 * | 8/2005 | Hashemian | G05B 23/0283 702/105 |
| 2006/0022681 | A1 * | 2/2006 | Muth | G01R 31/68 324/642 |
| 2006/0043976 | A1 * | 3/2006 | Gervais | G01R 31/58 324/508 |
| 2007/0085550 | A1 | 4/2007 | Wu et al. | |
| 2007/0115004 | A1 * | 5/2007 | Mirov | G01R 31/312 324/538 |
| 2008/0100304 | A1 * | 5/2008 | Huang | H04L 12/66 324/534 |
| 2012/0019366 | A1 * | 1/2012 | Aguren | H04B 10/07 340/10.1 |
| 2012/0126823 | A1 * | 5/2012 | Lussier | H01R 27/00 324/555 |
| 2013/0162262 | A1 * | 6/2013 | Johnson | G01R 31/58 324/539 |
| 2013/0221982 | A1 * | 8/2013 | Julson | G01R 31/11 324/539 |
| 2014/0002101 | A1 * | 1/2014 | Lussier | H01R 24/20 324/537 |
| 2015/0212025 | A1 * | 7/2015 | Francis-Buller | G01R 31/11 324/693 |
| 2016/0028193 | A1 * | 1/2016 | Du | H01R 13/6683 324/538 |
| 2016/0226169 | A1 * | 8/2016 | Hoshino | H01R 13/2435 |
| 2017/0212147 | A1 * | 7/2017 | Lussier | H01R 31/065 |
| 2017/0234767 | A1 * | 8/2017 | Leclerc | G01M 11/3145 356/73.1 |
| 2018/0097296 | A1 * | 4/2018 | Hittel | H01R 4/2404 |
| 2018/0114382 | A1 * | 4/2018 | Courter | H04L 12/00 |
| 2019/0049508 | A1 * | 2/2019 | Davis | G01R 31/50 |
| 2019/0186380 | A1 * | 6/2019 | Dardona | G05B 23/02 |
| 2020/0106481 | A1 * | 4/2020 | Mitchell | H04B 3/56 |

* cited by examiner

REFLECTOMETRY SYSTEM FOR DETECTING FAULTS ON A HARDENED MULTIPOINT CONNECTOR OF AN ELECTRICAL NETWORK

CROSS-REFERENCE TO RELATED APPLICATIONS

This application is a U.S. National Phase application of PCT/EP2018/063008 filed on May 17, 2018, claiming the benefit of French Application No. 1700557, filed on May 29, 2017, both of which are incorporated herein by reference in their entireties.

The present invention relates to a reflectometry system for detecting faults on a connector.

More particularly, the invention relates to such a reflectometry system suitable for detecting faults on a hardened multipoint connector of an electrical network.

In general, such a reflectometry system for example includes a measuring probe, associated with an oscilloscope, and making it possible to detect electrical faults within complex systems and harsh environments.

Such systems are for example found in submarine systems, rockets or aerospace vehicles.

Indeed, within these systems, it may be impossible to disassemble certain electrical elements in order to verify their electrical integrity, since standard electrical inspections, for example by line and contact resistance, insulation measurement, or dielectric strength measurement, are not sufficient to detect faults, due to the complex design of the electrical connections (small size, special materials, optimized design, high density of contacts).

In these cases, the only conceivable nondestructive inspection is a specific reflectometry measurement of the electrical line.

This detection technique is well known in the state of the art and is generally used to detect dead shorts over long lengths of cables, where precision is not necessarily a requirement (for example around a meter).

In the case of connectors in a harsh environment, the precision is around a millimeter and the frequency of the reflectometry must be increased (hyper frequency).

Thus, the connection of the reflectometer on the connector must be optimized in order to guarantee the quality of the signal and the reproducibility of the measurements.

Yet in the state of the art, this is difficult to achieve.

The invention therefore aims to resolve these problems.

To that end, the invention relates to a reflectometry system for detecting faults on a hardened multipoint connector of an electrical network, of the type that comprises a measuring probe, characterized in that it comprises an interfacing and impedance matching part that is electrically suitable (e.g., compatible) for mounting on the connector to be tested and comprises a body provided with at least one element in the form of a collector ring for the contact masses of the connector and a measuring opening for the probe of the reflectometry system.

According to other features of the reflectometry system according to the invention, considered alone or in combination:

the element in the form of a collector ring for the masses is associated with means for receiving and positioning the measuring probe across from a contact of the connector to be tested, the element in the form of a collector ring for the masses is associated with electrical spring contacts to preserve the functional endurance of the connector, the element in the form of a collector ring for the contact masses is removably associated with the body of the interfacing part, so as to be able to be replaced by another element in the form of an interchangeable collector ring for the masses having an opening for measuring access to a contact different from the connector in order to test it, the element in the form of a collector ring for the contact masses is separately associated with the body of the interfacing part, so as to be able to be moved and reassembled thereupon, so that its measuring opening provides access to different contacts of the connector in order to test them, the measuring probe is connected to an oscilloscope.

The invention will be better understood upon reading the following description, provided solely as an example, and done in reference to the appended drawings, in which.

Figure 1:
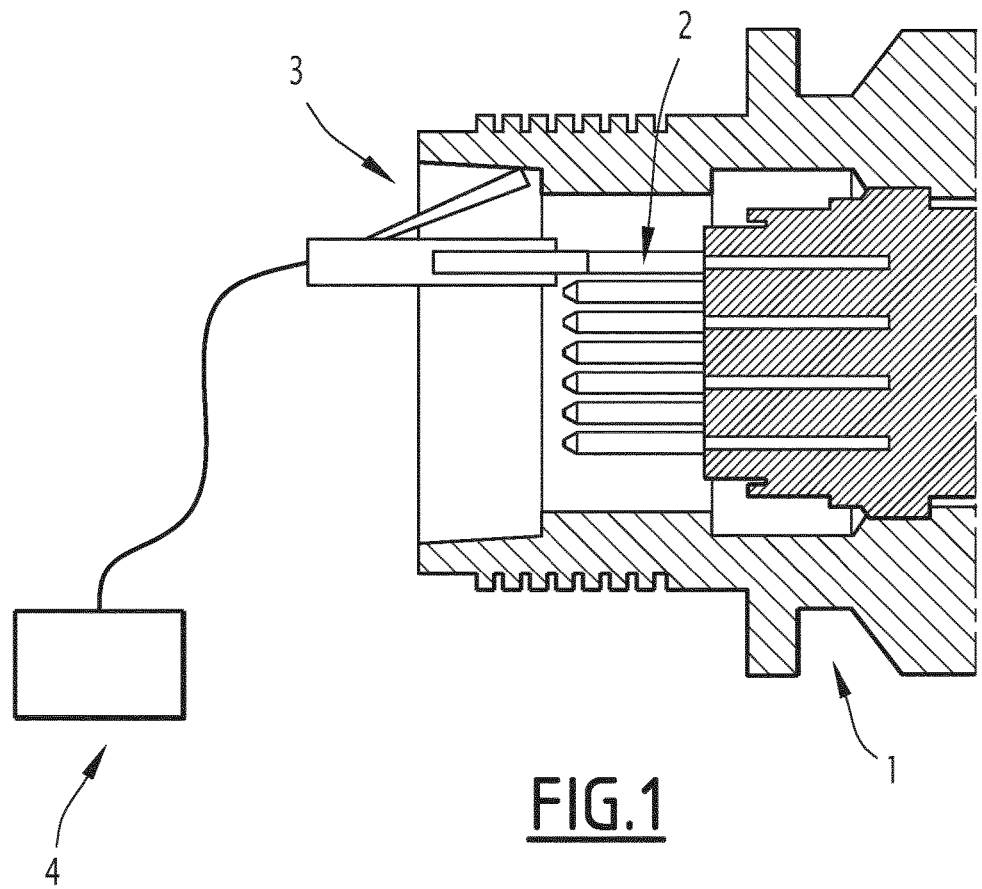
FIG. 1 shows a schematic sectional view of a reflectometry system of the state of the art.

These figures, and in particular FIG. 1, show a reflectometry system of the state of the art.

This system is used to detect faults on a hardened multipoint connector of an electrical network.

This connector is designated by general reference 1 in this FIG. 1, and it includes several electrical contacts, such as the contact designated by general reference 2 according to this same figure.

The reflectometry system also includes a measuring probe, designated by general reference 3, associated with an oscilloscope, designated by general reference 4.

This probe is suitable for being placed in contact with each electrical contact of the connector, in order to test the latter and potentially detect a fault of the corresponding network.

As previously indicated, this structure has a certain number of drawbacks, in particular in terms of the difficulty of positioning the probe correctly, and therefore in terms of the quality and reproducibility of the corresponding measurement.

To resolve these problems, in a reflectometry system according to the invention, an interfacing and impedance matching part is used including a collector ring for the masses and a measuring opening for the probe.

Figure 2:
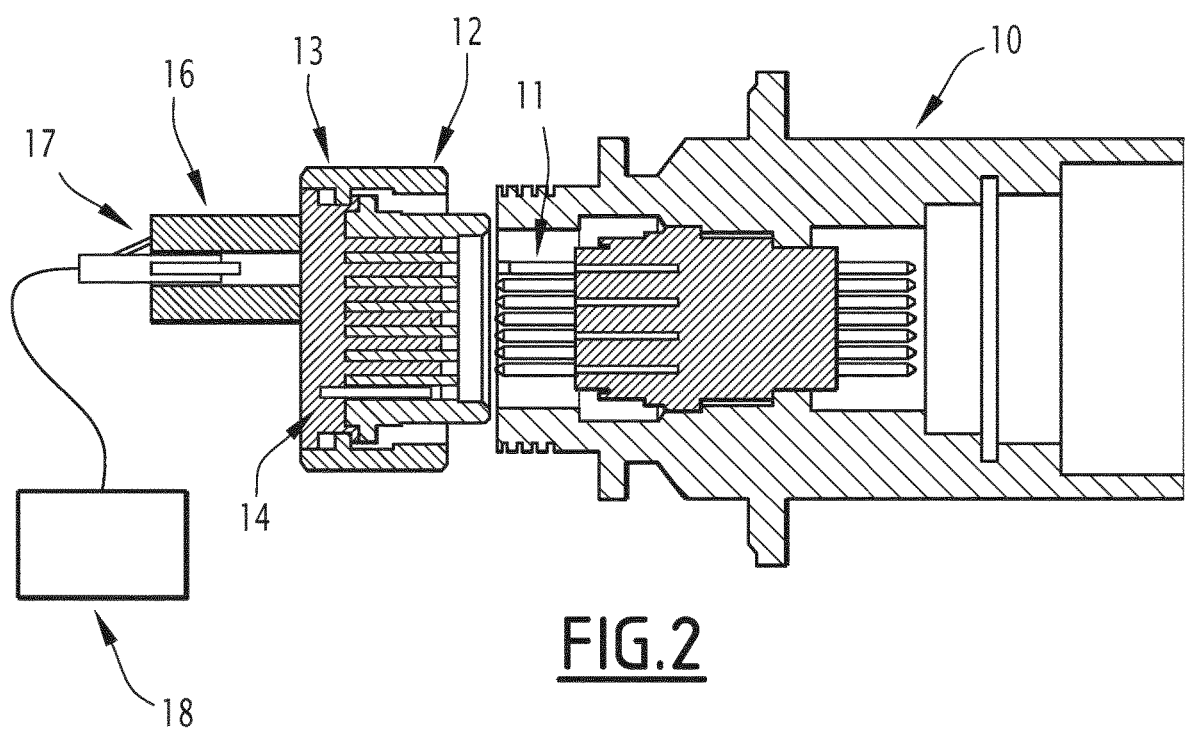
FIG. 2 shows a schematic sectional view of a reflectometry system according to the invention.
Figure 3:
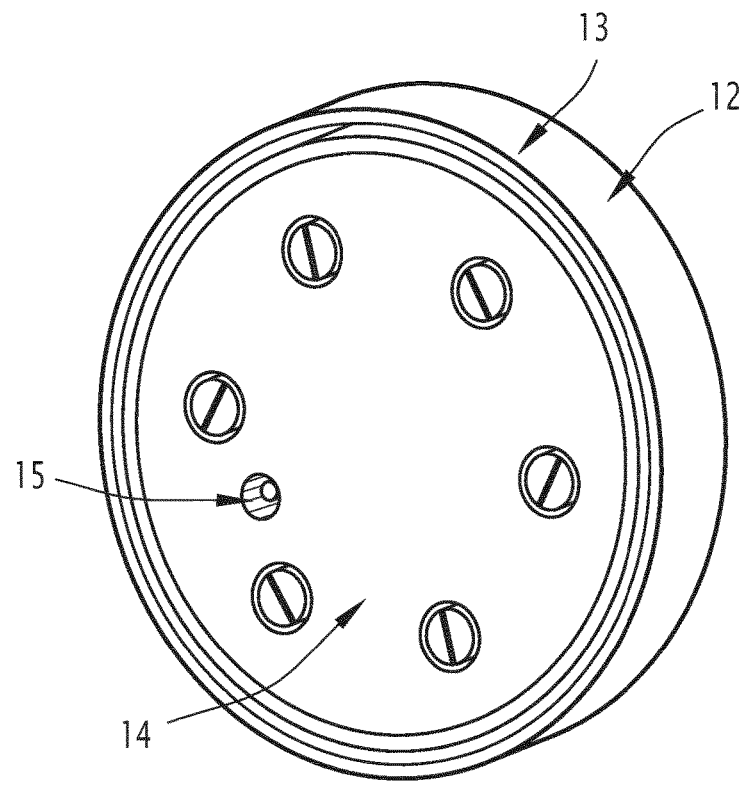
FIG. 3 shows an end view of an interfacing and impedance matching part included in the composition of a system according to the invention.

FIGS. 2 and 3 show an exemplary embodiment of such a system.

In these figures, the hardened multipoint connector of the electrical network is designated by general reference 10, and it still includes contacts, such as the contact designated by general reference 11.

The system according to the invention includes an interfacing and impedance matching part designed to be mounted on the connector to be tested, this interfacing and impedance matching part being designated by general reference 12.

This interfacing and impedance matching part is suitable for being mounted on the connector to be tested 10.

This part includes a body designated by general reference 13 in these figures, this body being provided with at least one element in the form of a collector ring for the contact masses of the connector, this ring being designated by general reference 14.

The body and the ring also include a measuring opening to allow the insertion of the probe of the reflectometry system, this opening for example being designated by general reference 15 in FIG. 3.

Indeed, and as illustrated in FIG. 2, the element in the form of a collector ring for the masses is also associated with means for receiving and positioning the measuring probe across from a contact of the connector to be tested.

In FIG. 2, these means for receiving and positioning the probe are designated by general reference 16 (e.g., a probe receptacle) and the probe is designated by general reference 17.

Conventionally, the latter is still connected to an oscilloscope, designated by general reference 18.

As is also illustrated in these figures and in particular in FIG. 2, the element 14 in the form of a collector ring for the contact masses is removably associated with the body 13 of the interfacing part.

This then for example makes it possible to replace this element with another interchangeable element in the form of a collector ring for the masses, having a measuring opening for access to a different contact of the connector in order to test it.

Of course, other embodiments can be considered, and for example, the element in the form of a collector ring for the contact masses can also be separately associated with the body of the interfacing part, so as to be able to be moved and reassembled thereupon, so that its measuring opening provides access to different contacts of the connector in order to test them.

Figure 4:
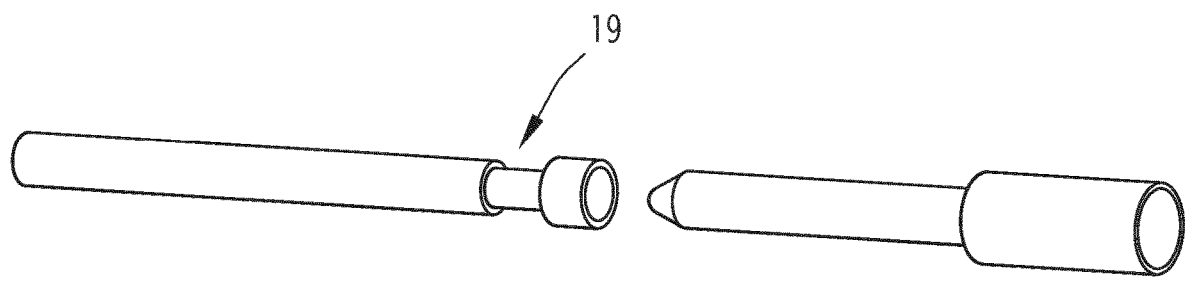
FIG. 4 illustrates an electrical spring contact used in a system according to the invention.

Lastly, and as illustrated in FIG. 4, it should be noted that the element in the form of a collector ring for the masses can be associated with electrical spring contacts, like that designated by general reference 19 in this FIG. 4, in order to preserve the functional endurance of the connector.

One can then see that such a structure has a certain number of advantages relative to the systems of the state of the art.

Indeed, the use of the interfacing part, as previously described, makes it possible to improve the quality of the contact and therefore the quality of the measurement and the reproducibility thereof, while being easier to implement.

Of course, still other embodiments may be considered.

The invention claimed is:

1. A reflectometry system for detecting faults on a hardened multipoint connector of an electrical network, comprising: (i) a measuring probe, and (ii) an interfacing and impedance matching part that is electrically compatible with and configured for mounting on a connector to be tested comprising a plurality of contacts, and comprises a body provided with at least one element in the form of a collector ring adapted to connect the contacts of the connector to a same mass except a contact of the connector to be tested, and a measuring opening for the measuring probe.

2. The reflectometry system according to claim 1, wherein the at least one element in the form of a collector ring is associated with a probe receptacle for receiving and positioning the measuring probe across from the contact of the connector to be tested.

3. The reflectometry system according to claim 1, wherein the at least one element in the form of a collector ring is associated with electrical spring contacts of the connector to be tested to preserve a functional endurance of the connector.

4. The reflectometry system according to claim 1, wherein the at least one element in the form of a collector ring is removably associated with the body of the interfacing and impedance matching part, so as to be able to be replaced by another element in the form of an interchangeable collector ring having an opening for measuring access to a contact different from the connector in order to test the different contact.

5. The reflectometry system according to claim 1, wherein the at least one element in the form of a collector ring is separately associated with the body of the interfacing and impedance matching part, so as to be able to be moved and reassembled thereupon, so that the measuring opening provides access to different contacts of the connector in order to test the different contacts.

6. The reflectometry system according to claim 1, wherein the measuring probe is connected to an oscilloscope.

* * * * *